US007525878B2

(12) United States Patent
Watanabe

(10) Patent No.: US 7,525,878 B2
(45) Date of Patent: Apr. 28, 2009

(54) TIME MEASURING CIRCUIT WITH PULSE DELAY CIRCUIT

(75) Inventor: Takamoto Watanabe, Nagoya (JP)

(73) Assignee: DENSO CORPORATION, Kariya (JP)

( * ) Notice: Subject to any disclaimer, the term of this patent is extended or adjusted under 35 U.S.C. 154(b) by 62 days.

(21) Appl. No.: 11/807,712

(22) Filed: May 30, 2007

(65) Prior Publication Data

US 2007/0280054 A1 Dec. 6, 2007

(30) Foreign Application Priority Data

May 31, 2006 (JP) ............................ 2006-152331

(51) Int. Cl.
*G04F 10/00* (2006.01)
*H03H 11/01* (2006.01)

(52) U.S. Cl. ...................................... 368/120; 327/277

(58) Field of Classification Search ................ 368/113, 368/120; 327/261, 263, 264, 276, 277
See application file for complete search history.

(56) References Cited

U.S. PATENT DOCUMENTS

| | | | | |
|---|---|---|---|---|
| 5,128,624 | A | 7/1992 | Hoshino et al. | |
| 5,231,319 | A * | 7/1993 | Crafts et al. | 327/277 |
| 5,289,135 | A | 2/1994 | Hoshino et al. | |
| 5,459,402 | A * | 10/1995 | Ueno et al. | 324/617 |
| 5,568,071 | A | 10/1996 | Hoshino et al. | |
| 5,712,582 | A | 1/1998 | Yokota et al. | |
| 6,229,364 | B1 * | 5/2001 | Dortu et al. | 327/158 |
| 6,316,987 | B1 * | 11/2001 | Dally et al. | 327/538 |
| 7,295,053 | B2 * | 11/2007 | Lesso | 327/158 |
| 2001/0054925 | A1 * | 12/2001 | Dally et al. | 327/276 |
| 2006/0145683 | A1 | 7/2006 | Shigeta et al. | |
| 2008/0252353 | A1 * | 10/2008 | Kim et al. | 327/277 |

FOREIGN PATENT DOCUMENTS

| | | |
|---|---|---|
| JP | 3-220814 | 9/1991 |
| JP | 05-067953 | 3/1993 |
| JP | 09-005408 | 1/1997 |
| JP | 2006-115274 | 4/2006 |
| JP | 2006-208360 | 8/2006 |

* cited by examiner

*Primary Examiner*—Vit W Miska
(74) *Attorney, Agent, or Firm*—Harness, Dickey & Pierce, PLC

(57) ABSTRACT

In a time measuring circuit, a pulse delay circuit is provided with a plurality of delay units. The pulse delay circuit is configured to transfer a pulse signal through the plurality of delay units while the pulse signal is delayed by the plurality of delay units. A delay time of each of the plurality of delay units depends on a level of a first drive voltage being input to each of the plurality of delay units. A generating circuit is configured to obtain a number of the delay units through which the pulse signal has passed within a predetermined period to generate, as time measurement data, digital data based on the obtained number. A first setting unit is configured to variably set the level of the first drive voltage being input to each of the plurality of delay units.

10 Claims, 9 Drawing Sheets

TIME MEASURING CIRCUIT WITH PULSE DELAY CIRCUIT

CROSS REFERENCE TO RELATED APPLICATIONS

This application is based on Japanese Patent Application 2006-152331 filed on May 31, 2006. This application claims the benefit of priority from the Japanese Patent Application, so that the descriptions of which are all incorporated herein by reference.

FIELD OF THE INVENTION

The present invention relates to time measuring circuits with a pulse delay circuit consisting of a plurality of delay units.

BACKGROUND OF THE INVENTION time measuring circuits for measuring a phase difference between input pulses as a time have been developed, which are for example disclosed in U.S. Pat. No. 5,568,071 corresponding to Japanese Unexamined Patent Publication No. H03-220814.

The time measuring circuits of the U.S. patent publication are each composed of a plurality of digital circuits each configured to perform a particular logical function based on at least two discrete voltage levels.

Specifically, one typical example of the time measuring circuits includes a pulse delay circuit composed of a plurality of delay units that corresponds to a plurality of stages of delay. The delay units are connected to one another in series or in a ring-like structure.

In the time measuring circuit, when a starting pulse is input to one of the delay units corresponding to the first stage of delay, the starting pulse is sequentially transferred by the delay units while being delayed thereby in the order from the first stage of delay units toward the last stage thereof.

The time measuring circuit is designed to:

count a number of stages (pulse delay units) through which a pulse signal has passed since the input of the starting pulse up to an input of a measuring pulse to the time measuring circuit; and output digital data based on the counted number of stages (pulse delay units) as a phase difference (time difference) between the starting pulse and the measuring pulse.

Such a time measuring circuit requires no analog circuits and consists entirely of a plurality of digital circuits, which makes it possible to easily design time measuring circuits as ICs (Integral Circuits).

In measurement of a time, there are requirements to measure a micro time length with a high resolution, such as a requirement for laser radars to measure a period of time elapsing between transmission of a laser beam and receipt of a reflected beam from the target. In contrast, there are requirements to measure a comparatively long time length with a comparatively low resolution, such as a requirement for ultrasonic sonars to measure a period of time elapsing between transmission of an ultrasonic wave and receipt of a reflected wave from the target.

A resolution required to measure a micro time length and that required to measure a comparatively long time length may differ from each other by ten orders of magnitude.

To meet the micro time-length measurement requirements with high resolution, in a conventional time measuring circuit, shortage of a delay time of each delay unit (each stage in delay) constituting the pulse delay circuit is needed. The shorter the delay time of each delay unit is, in other words, the higher the resolution of a conventional time measuring circuit, the more the number of stages through which a starting pulse signal has passed in the pulse delay circuit during even a predetermined same period. This may cause, in order to meet the long time-length measurement requirements with low resolution, a structure of a conventional time measuring circuit required to count the number of stages to increase in size, which may increase the conventional time measuring circuit in size.

As a different approach, to meet both the micro time-length measurement requirements with high resolution and the long time-length measurement requirements with low resolution, a conventional time measuring circuit can be provided with at least a pair of first and second time measuring modules. The first time measuring module is designed to implement micro time-length measurement with high resolution. In addition, the second time measuring module is designed to implement long time-length measurement with low resolution.

Specifically, the conventional time measuring circuit of another approach is configured to select any one of the first time measuring module and the second time measuring module depending on the intended use.

The different approach however may also cause a conventional time measuring circuit to increase in size.

SUMMARY OF THE INVENTION

In view of the background, an object of at least one aspect of the present invention is to provide time measuring circuits, which are capable of implementing both short time-length measurement with high resolution and long time-length measurement with low resolution while preventing their sizes from substantially increasing.

According to one aspect of the present invention, there is provided a time measuring circuit. The time measuring circuit includes a pulse delay circuit provided with a plurality of delay units. The pulse delay circuit is configured to transfer a pulse signal through the plurality of delay units while the pulse signal is delayed by the plurality of delay units. A delay time of each of the plurality of delay units depends on a level of a first drive voltage being input to each of the plurality of delay units. The time measuring circuit includes a generating circuit configured to obtain a number of the delay units through which the pulse signal has passed within a predetermined period to generate, as time measurement data, digital data based on the obtained number. The time measuring circuit includes a first setting unit configured to variably set the level of the first drive voltage being input to each of the plurality of delay units.

BRIEF DESCRIPTION OF THE DRAWINGS

Other objects and aspects of the invention will become apparent from the following description of embodiments with reference to the accompanying drawings in which.

DETAILED DESCRIPTION OF EMBODIMENTS OF THE INVENTION

Figure 1A:
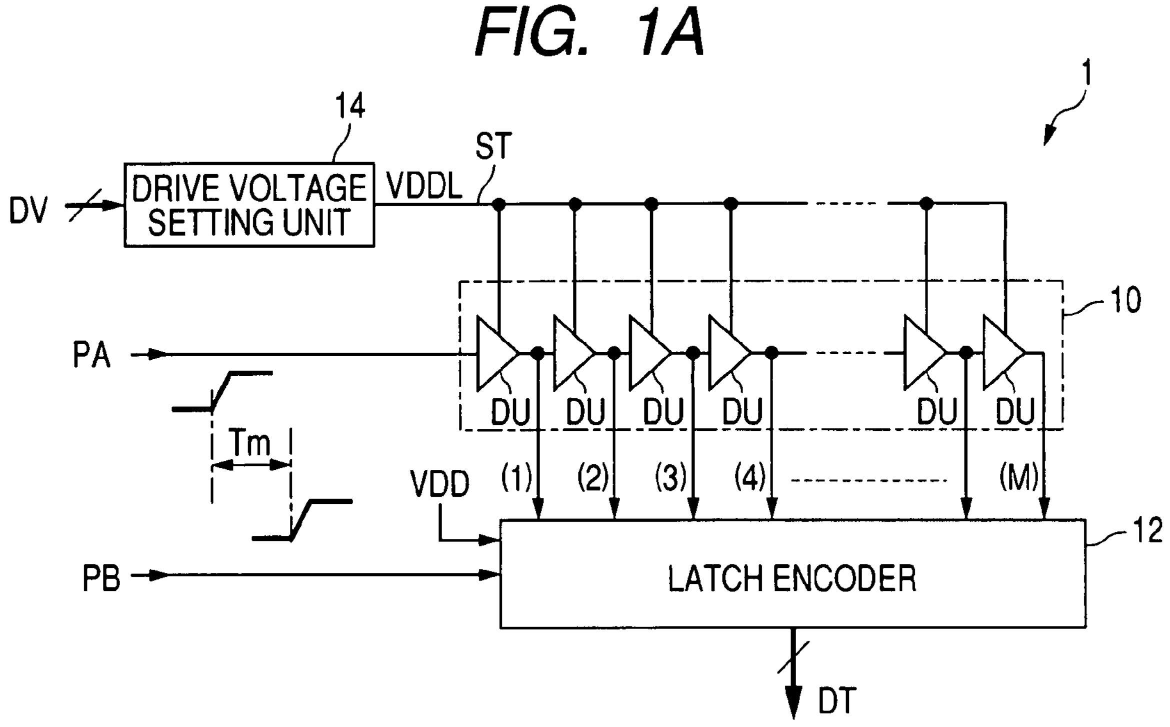
FIG. 1A is a block diagram schematically illustrating an example of the overall structure of a time measuring circuit according to a first embodiment of the present invention.

Embodiments of the present invention will be described hereinafter with reference to the accompanying drawings. In the drawings, identical reference characters are utilized to identify identical corresponding components.

First Embodiment

FIG. 1A schematically illustrates an example of the overall structure of a time measuring circuit 1 according to a first embodiment to which the present invention is applied.

As illustrated in FIG. 1A, the time measuring circuit 1 includes a pulse delay circuit, in other words, a straight delay line (SDL) 10.

The pulse delay circuit 10 is composed of a number of M (M is a positive integer) of delay units DU that corresponds to the number M of stages in delay.

Each of the delay units DU has one input terminal and one output terminal.

One of the delay units DU located at one end of the straight delay line 10 constitutes a first stage of delay, which will also be referred to as "first delay unit" hereinafter. In addition, one of the delay units DU located at the other end of the straight delay line 10 constitutes a last stage of delay, which will also be referred to as "last delay unit" hereinafter.

The input terminal of a delay unit DU except for the first delay unit is connected to the output terminal of an adjacent delay unit DU except for the last delay unit so that the delay units DU are connected to each other in series.

The first delay unit DU is designed such that a starting pulse PA is configured to be input to the one input terminal thereof.

When the starting pulse signal PA is input to the one input terminal of the first delay unit DU, the first delay unit DU works to transfer a pulse signal to the next delay unit DU while retarding it by a predetermined time of delay.

Each of the remaining delay units DU except for the last delay unit DU sequentially transfers the pulse signal output from the previous delay unit to the next delay unit while retarding the pulse signal by a predetermined time of delay.

The time measuring circuit 1 includes a latch encoder 12 connected to the output terminal of each of the delay units DU. A measuring pulse PB is configured to be input to the latch encoder 12.

The time measuring circuit 1 includes a drive voltage setting unit 14 operative to generate a drive voltage (power supply voltage) VDDL.

The latch encoder 12 is operative to detect a position that a significant edge, such as rising edge, of a pulse signal has reached when the measuring pulse PB is turned high, and convert the detected position of the pulse signal into predetermined bits of time measurement data DT.

The time measurement data DT of the predetermined bits represents what number stage from the first stage (first delay unit) is a delay unit through which the pulse signal at the detected position has passed within a period of time Tm since the rising timing of the starting pulse PA up to the riding timing of the measuring pulse PB.

Note that numerals inside the parentheses illustrated in FIG. 1A represent the number of stages in delay of the pulse delay circuit 10.

The time measuring circuit 1 is configured as a semiconductor IC mounted on a semiconductor substrate (IC chip) using a CMOS process.

For example, the time measuring circuit 1 consists entirely of a plurality of CMOS inverter gates having substantially identical characteristics with each other.

Figure 1B:
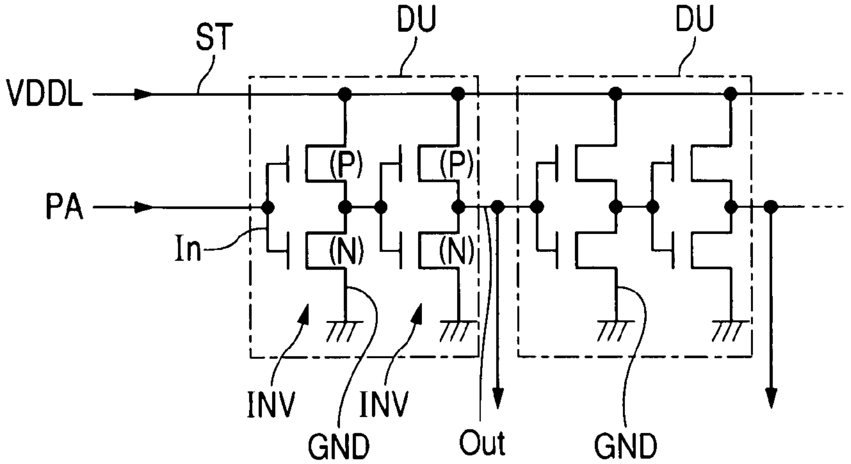
FIG. 1B is a circuit diagram schematically illustrating an example of the structure of delay units illustrated in FIG. 1A.

As illustrated in FIG. 1B, each of the delay units DU is designed as a first CMOS inverter gate INV consisting of a pair of a P-channel transistor (P-channel MOSFET) and an N-channel transistor (N-channel MOSFET) connected thereto in series, and a second CMOS inverter gate INV consisting of a pair of a P-channel MOSFET and an N-channel MOSFET connected thereto in series. The first CMOS inverter gate INV and the second CMOS inverter gate INV are connected to each other in series to constitute a buffer circuit working to output a signal input thereto while delaying it.

As illustrated in FIG. 1B, a power supply terminal ST for the drive voltage VDDL is connected to each of the delay units DU, and a ground terminal GND is connected to each of the delay units DU.

The drive voltage setting unit 14 operates on a power supply voltage that can be supplied from a battery or power source (not shown) of the time measuring circuit 1.

The drive voltage setting unit 14 works to apply the generated drive voltage VDDL to each of the delay units DU through the power supply terminal ST. In FIG. 1B, reference character In represents an input terminal of a delay unit DU, and reference character Out represents an output terminal of a delay unit DU.

The latch encoder 12 includes a latch operative to, when the measuring pulse PB is turned high, detect a position that the rising edge of the pulse signal has reached. The latch encoder 12 includes an encoder operative to convert the detected position of the pulse signal latched by the latch into predetermined bits of binary digital data DT.

The latch and the encoder of the latch encoder 12 are each configured to operate on a constant power supply voltage.

Specifically, as illustrated in FIG. 1B, when a pulse signal input to the first CMOS inverter gate INV of a delay unit DU is high, the N-channel MOSFET is on, so that an output signal of the first CMOS inverter gate INV of a delay unit DU is low. This allows a pulse signal with a low state to be transferred from the first CMOS inverter gate INV. Similarly, when the pulse signal input to the second CMOS inverter gate INV of a delay unit DU is low, the P-channel MOSFET is on, so that an output signal of the second CMOS inverter gate INV of a delay unit DU is high. This allows a pulse signal with a high state to be transferred via the second CMOS inverter gate INV.

In contrast, when a pulse signal input to the first CMOS inverter gate INV of a delay unit DU is low, the P-channel MOSFET is on, so that an output signal of the first CMOS inverter gate INV of a delay unit DU is high. This allows a pulse signal with a high state to be transferred from the first CMOS inverter gate INV. Similarly, when the pulse signal input to the second CMOS inverter gate INV of a delay unit DU is high, the N-channel MOSFET is on, so that an output signal of the second CMOS inverter gate INV of a delay unit DU is low. This allows the pulse signal with a low state to be transferred via the second CMOS inverter gate INV.

Specifically, a delay unit DU serves as a buffer unit such that a pulse signal input to a delay unit DU is output therefrom while its logical state is kept unchanged.

Because an operating time of each of the inverter gates INV of each delay unit DU depends on the level of the input derive voltage VDDL, the delay time of each delay unit depends on the level of the input drive voltage VDDL.

For this reason, when the drive voltage VDDL is set to be constant in level, the number of stages of the delay units DU through which the pulse signal has passed is configured to be proportional to an elapsed time since the input of the starting pulse PA to the pulse delay circuit 10. The greater the drive voltage VDDL in level, the lower the proportional constant between the number of stages and the elapsed time.

Figure 2:
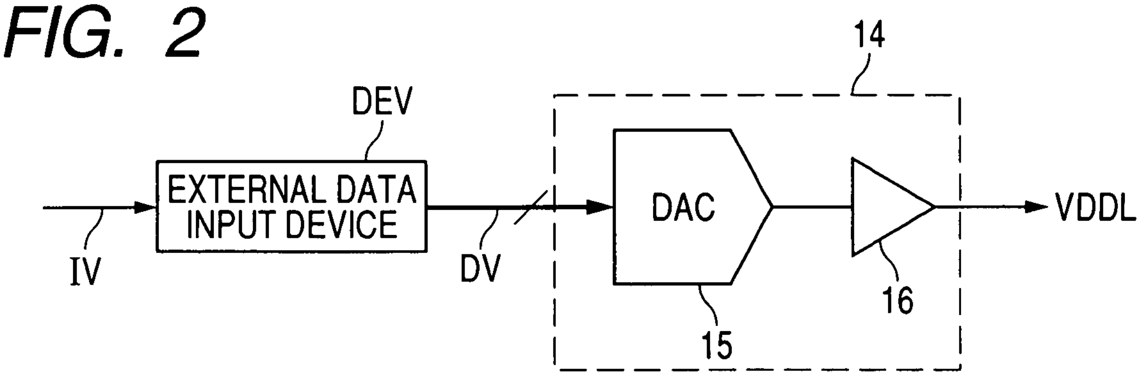
FIG. 2 is a block diagram schematically illustrating an example of the structure of a drive voltage setting unit illustrated in FIG. 1A.

As illustrated in FIG. 2, the drive voltage setting unit 14 is composed of a digital-analog (D/A) converter (DAC) 15 and a buffer 16 connected to the D/A converter 15. With the D/A converter 15, an external data input device DEV operable by a user can be communicable.

The external data input device DEV for example consists of a computer circuit and works to generate voltage setting data (digital data) DV representing one of voltage levels; this one of the voltage levels corresponds to, for example, voltage setting information IV manually input to the external data input device DEV.

Specifically, change of the manually input voltage-setting information IV allows one of the voltage levels represented by the voltage setting data DV to be adjusted.

The D/A converter 15 has an output terminal and works to convert the generated voltage setting data DV into the drive voltage VDDL whose level corresponds to one of the voltage levels represented by the voltage setting data DV.

The buffer 16 has an input terminal connected to the output terminal of the D/A converter 15. The buffer 16 works to assist the drive performance of the D/A converter 15.

Specifically, the voltage setting data DV representing one of voltage levels corresponding to the voltage setting information IV is converted by the D/A converter 15 to be output, as the drive voltage VDDL, via the buffer 16 to each of the delay units DU.

In the structure of the time measuring circuit 1 set forth above, when the voltage setting data DV corresponding to the voltage setting information IV representing a comparatively lower voltage level $V_L$ is input to the drive voltage setting unit 14, the drive voltage VDDL having the comparatively low level $V_L$ corresponding to the voltage setting data DV (voltage setting information IV) is output from the drive voltage setting unit 14 to each of the drive units DU.

Figure 3A:
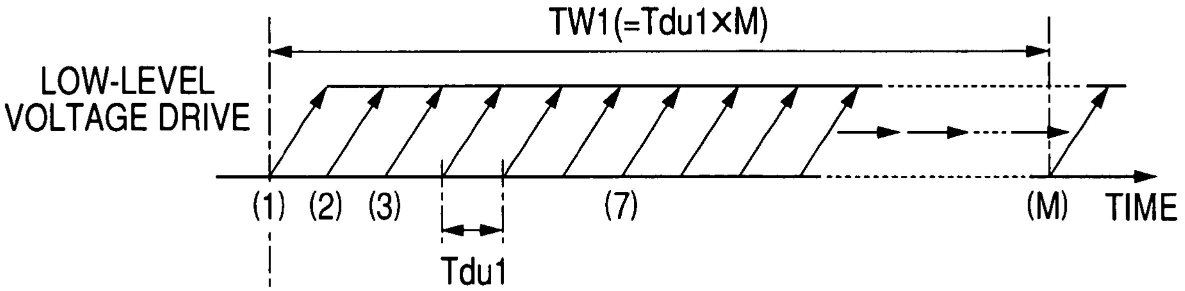
FIG. 3A is a view schematically illustrating operations of stages of delay of the pulse delay circuit based on a drive voltage with a comparatively low level according to the first embodiment.

FIG. 3A schematically illustrates operations of the stages of delay (delay units) (1), (2), . . . , (M) of the pulse delay circuit 10 based on the drive voltage VDDL with the comparatively low level $V_L$.

As illustrated in FIG. 3A, a delay time Tdu1 of each of the stages of delay (1), (2), . . . , (M) is comparatively long, so that a time resolution of the time measurement data DT equivalent to the delay time Tdu1 of each of the stages of delay (1), (2), . . . , (M) is comparatively low.

The comparatively low time resolution causes a time range (time width) TW1 of the time measuring circuit 1 using the drive voltage VDDL with the comparatively low level $V_L$ to be comparatively wide. A time range means a range of time lengths measurable by the time measuring circuit 1. That is, the time range TW1 of the time measuring circuit 1 using the drive voltage VDDL with the comparatively low level $V_L$ is given by "Tdu1×M".

On the other hand, when the voltage setting information IV representing a voltage level $V_H$ higher than the low level $V_L$ is input to the drive voltage setting unit 14, the drive voltage VDDL having the voltage $V_H$ higher than the low level $V_L$ and corresponding to the voltage setting information IV is output from the drive voltage setting unit 14 to each of the drive units DU.

Figure 3B:
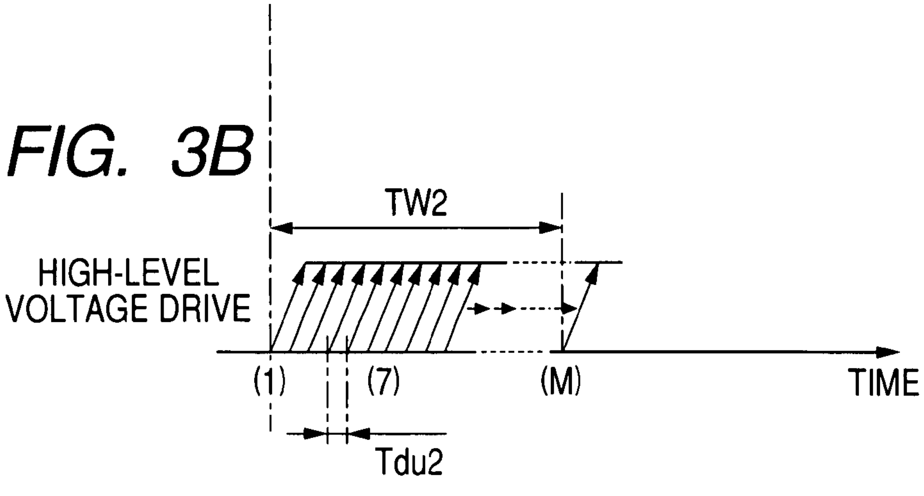
FIG. 3B is a view schematically illustrating operations of stages of delay of the pulse delay circuit based on a drive voltage with a level higher than the low level according to the first embodiment.

FIG. 3B schematically illustrates operations of the stages of delay (1), (2), . . . , (M) of the pulse delay circuit 10 based on the drive voltage VDDL with the voltage level $V_H$ higher than the low level $V_L$.

As illustrated in FIG. 3B, a delay time Tdu2 of each of the stages of delay (1), (2), . . . , (M) is shorter than the delay time Tdu1, so that a time range TW2 of the time measuring circuit 1 using the drive voltage VDDL with the voltage level $V_H$ to be narrower than the time range TW1; this time range TW2 is given by "Tdu2×M".

The narrower time range TW2 causes a time resolution of the time measurement data DT equivalent to the delay time Tdu2 of each of the stages of delay (1), (2), . . . , (M) to be higher than the time resolution based on the time range TW1.

In CMOS-circuit design rules applied to manufacturing of the time measuring circuit 1, the minimum size of transistors has been determined, which allows transistors with various sizes larger than the minimum size to be freely used to manufacture the time measuring circuit 1.

Figure 4B:
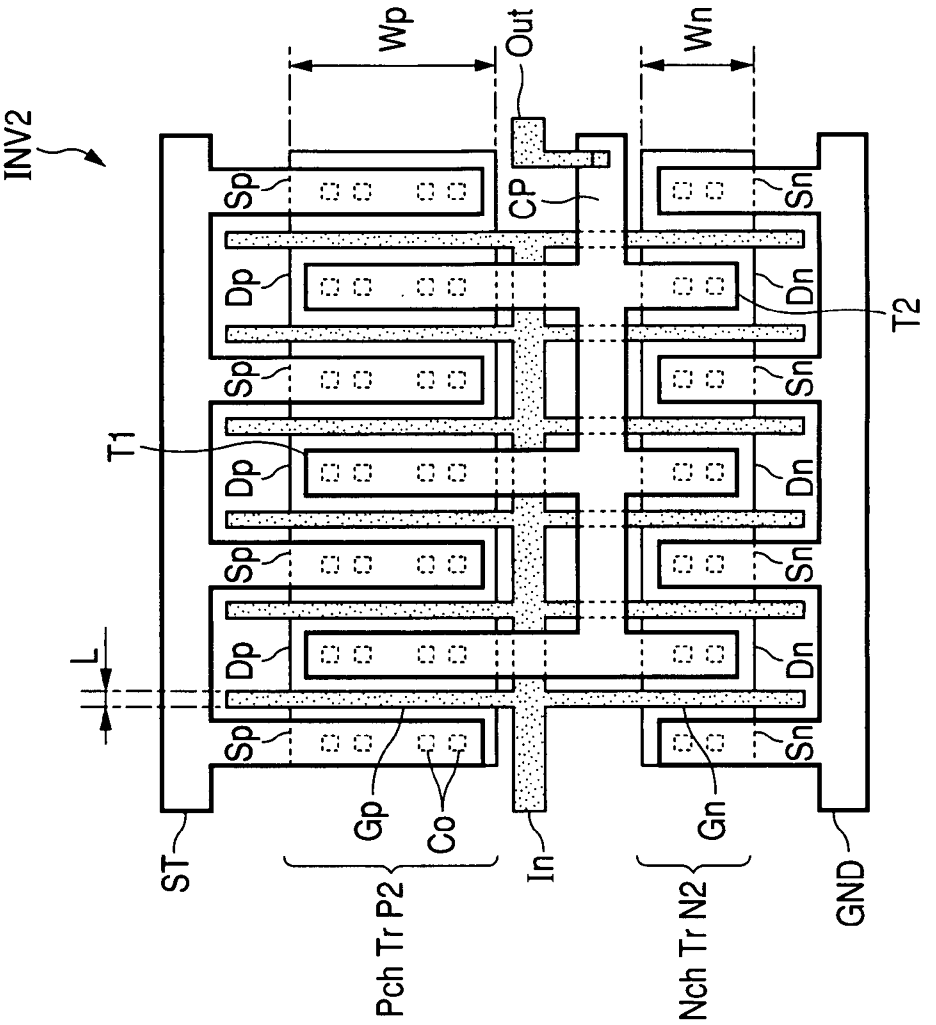
FIG. 4B is a view schematically illustrating a conductor pattern of a CMOS inverter gate to be used for the time measuring circuit illustrated in FIG. 1A, which uses a P-channel transistor and an N-channel transistor each of which has a size larger than the minimum size.
Figure 4A:
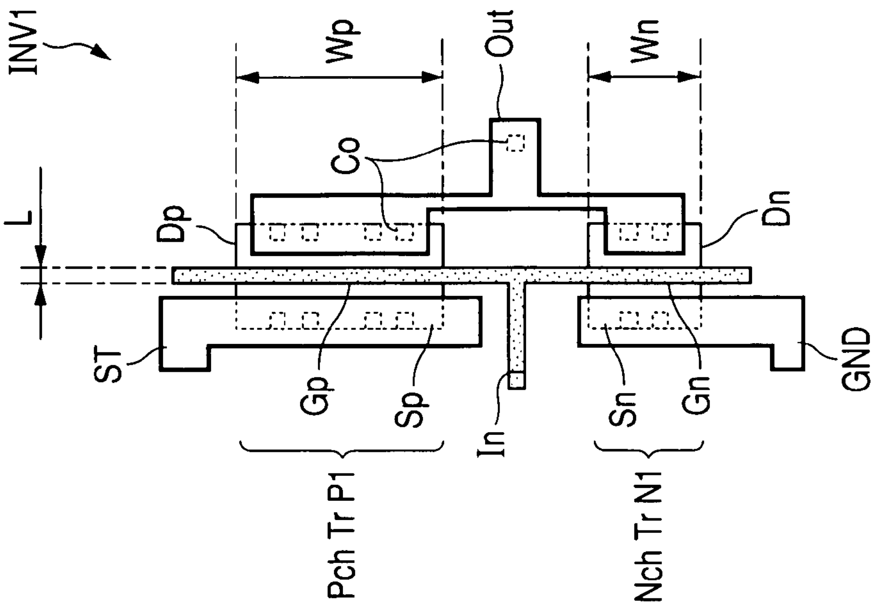
FIG. 4A is a view schematically illustrating a conductor pattern of a CMOS inverter gate to be used for the time measuring circuit illustrated in FIG. 1A, which uses a P-channel transistor and an N-channel transistor each of which has a minimum size.

FIG. 4A schematically illustrates a conductor pattern of a CMOS inverter gate INV1 to be used for the time measuring circuit 1; this CMOS inverter gate INV1 uses a P-channel transistor (abbreviated by P-ch Tr) P1 and an N-channel transistor (abbreviated by N-ch Tr) N1 each of which has the minimum size.

In addition, FIG. 4B schematically illustrates a conductor pattern of a CMOS inverter gate INV2 to be used for the time measuring circuit 1; this CMOS inverter gate INV2 uses a P-channel transistor P2 and an N-channel transistor N2 each of which has a size larger than the minimum size.

As illustrated in FIG. 4A, a substantially rectangular drain region Dp and a substantially rectangular source region Sp of the P-channel transistor P1 are formed on the semiconductor substrate with a channel region therebetween.

Similarly, a substantially rectangular drain region Dn and a substantially rectangular source region Sn of the N-channel transistor N1 are formed on the semiconductor substrate with a channel region therebetween such that the channel region of the P-channel transistor P1 and that of the N-channel transistor N1 is aligned with a space therebetween.

A substantially strip gate electrode Gp of the P-channel transistor P1 is formed on the channel region of the P-channel transistor P1 via an insulating film. A substantially strip gate electrode Gn of the N-channel transistor N1 extends from one end of the gate electrode Gp, and is formed on the channel region of the N-channel transistor N1 via an insulating film.

A conductive trace constituting the power supply terminal ST is mounted on the source region Sp of the P-channel transistor P1 through contacts Co. A conductive trace constituting the ground terminal GND is mounted on the source region Sn of the N-channel transistor N1 through contacts Co.

A conductive trace constituting the input terminal In orthogonally extends from the integrated gate electrode Gp, Gn. A conductive trace constituting the output terminal Out is mounted on both the drain regions Dp of the P-channel transistor P1 and the drain region Dn of the N-channel transistor N1 via contacts Co.

A gate width L of the CMOS inverter gate INV1 corresponds to a channel length between the drain region Dp (Dn) and the source region Sp (Sn). A channel width Wp of the CMOS inverter gate INV1 corresponds to a width of the P-channel transistor P1 orthogonal to the channel length thereof. A channel width Wn of the CMOS inverter gate INV1 corresponds to a width of the N-channel transistor N1 orthogonal to the channel length thereof.

In addition, as illustrated in FIG. 4B, a plurality of substantially rectangular drain regions Dp and a plurality of substantially rectangular source regions Sp of the P-channel transistor P2 are alternatively formed on the semiconductor substrate with channel regions therebetween.

Similarly, a plurality of substantially rectangular drain regions Dn and a plurality of substantially rectangular source regions Sn of the N-channel transistor N2 are alternatively formed on the semiconductor substrate with channel regions therebetween such that the channel regions of the P-channel transistor P2 and those of the N-channel transistor N2 are aligned to each other with spaces therebetween.

A substantially comb gate has a strip electrode B arranged between the P-channel source and drain regions and the N-channel source and drain regions. The substantially comb gate has a plurality of strip gate electrodes Gp of the P-channel transistor P2 orthogonally extending from the strip electrode B.

The substantially comb gate has a plurality of strip gate electrodes Gn of the N-channel transistor N2 orthogonally extending from the strip electrode B.

The strip gate electrodes Gp are formed on the channel regions of the P-channel transistor P2 via insulating films, respectively.

The strip gate electrodes Gn of the N-channel transistor N2 respectively extend from one ends of the gate electrodes Gp, and are formed on the channel regions of the N-channel transistor N2 via insulating films, respectively.

A comb conductive trace constituting the power supply terminal ST is mounted on the source regions Sp of the P-channel transistor P2 through contacts Co. A comb conductive trace constituting the ground terminal GND is mounted on the source regions Sn of the N-channel transistor N2 through contacts Co.

A conductive trace constituting the input terminal In orthogonally extends from the strip electrode B of the substantially comb gate.

A substantially comb conductive trace constituting the output terminal Out is arranged between the P-channel source and drain regions and the N-channel source and drain regions.

The substantially comb conductive pattern CP constituting the output terminal Out has a plurality of first strip traces T1 orthogonally extending therefrom and mounted on the drain regions Dp of the P-channel transistor P2 via contacts Co, respectively. The substantially comb conductive pattern CP has a plurality of second strip traces T2 orthogonally extending therefrom and mounted on the drain regions Dn of the N-channel transistor N2 via contacts Co, respectively.

A gate width L of each of the gate electrodes Gp, Gn of the CMOS inverter gate INV2 is equivalent to a channel length between each of the drain regions Dp (Dn) and a corresponding source region Sp (Sn) adjacent thereto.

A channel width Wp of the CMOS inverter gate INV2 corresponds to a width of the P-channel transistor P2 orthogonal to the channel length thereof. A channel width Wn of the CMOS inverter gate INV2 corresponds to a width of the N-channel transistor N2 orthogonal to the channel length thereof.

Specifically, as illustrated in FIGS. 4A and 4B, the gate width L of the CMOS inverter gate INV1 is designed to be substantially equivalent to that of each of the gate electrodes Gp, Gn of the CMOS inverter gate INV2.

In addition, the channel width Wp of the CMOS inverter gate INV1 is designed to be substantially equivalent to that of the CMOS inverter gate INV2, and the channel width Wn of the CMOS inverter gate INV1 is designed to be substantially equivalent to that of of the CMOS inverter gate INV2.

Thus, change the number of the gate electrodes Gp and Gn of the CMOS inverter gate INV2 allows the size of the transistors P2 and N2 (the size of the CMOS inverter gate INV2) to be adjusted.

Note that, in the CMOS inverter gate INV1 illustrated in FIG. 4A, the channel width Wp designed to be greater than the channel width Wn allows the drivability of the P-channel transistor P1 and that of the N-channel transistor N1 to be matched with each other. For example, the channel width Wp of the CMOS inverter INV1 is twice as much as the channel width Wn thereof, which allows a threshold voltage of the CMOS inverter INV1 to be a half of the drive voltage VDD.

Similarly, in the CMOS inverter gate INV2 illustrated in FIG. 4B, the channel width Wp designed to be greater than the channel width Wn allows the driving abilities of the P-channel transistor P2 and the N-channel transistor N2 to be matched with each other. In the first embodiment, the channel width Wp of the CMOS inverter INV2 is twice as much as the channel width Wn thereof, which allows a threshold voltage of the CMOS inverter INV2 to be a half of the drive voltage VDDL.

Moreover, each of transistors constituting the latch encoder 12 has the minimum size determined by the CMOS-circuit design rules applied to manufacturing of the time measuring circuit 1 (see FIG. 4A).

In contrast, each of transistors constituting the pulse delay circuit 10 has a size six times as much as the size of a transistor of the latch encoder 12 (see FIGS. 4A and 4B).

The maximum level of the drive voltage VDDL to be generated by the drive voltage setting unit 14 has been determined to be equivalent to a drive voltage VDD by which the latch encoder 12 is driven. The drive voltage VDD can be supplied from the battery or the power source of the time measuring circuit 1.

The minimum level of the drive voltage VDDL to be generated by the drive voltage setting unit 14 has been determined to be equivalent to a threshold voltage of a CMOS inverter gate of the latch encoder 12 corresponding to each of the delay units DU. Specifically, each of the CMOS inverter gates of the latch encoder 12 works to latch an output of a corresponding one of the delay units DU. For example, the threshold voltage of each of the CMOS inverter gates of the latch encoder 12 is set to a half of the drive voltage VDD.

In the time measuring circuit 1 according to the first embodiment, the drive voltage setting circuit 14 has a comparatively compact size (see FIG. 2), and is configured to variably set, based on the voltage setting data DV externally input thereto, a level of the drive voltage VDDL to be supplied to each of the delay units DU. The variable set of the level of the drive voltage VDDL permits the delay time Tdu of each of the delay units DU to be variably adjusted.

The variable adjustment of the delay time Tdu of each of the delay units DU makes it possible to implement measurement of desirable time ranges with corresponding resolutions, such as measurement of short time ranges with a high resolution and that of large time ranges with a low resolution, while preventing the size of the circuit 1 from substantially increasing.

Thus, the time measuring circuit 1 can be applied to measurement systems that need real-time selection of their measurement ranges according to the circumstances. In addition, the time measurement circuit 1 can be commonly applied to various pieces of system equipment whose target specifications are associated with their measurement ranges. It is therefore possible to reduce the cost of systems for measuring time lengths using the time measuring circuit 1, and to shorten the development period of the systems.

In the time measuring circuit 1 according to the first embodiment, the size of transistors constituting the pulse delay circuit 10 is larger than that of transistors constituting the latch encoder 12. This can reduce variations in the characteristics of the transistors constituting the pulse delay circuit 10 due to dimensional deviations of the transistors constituting the pulse delay circuit 10 in manufacturing and/or adhesion of debris particles onto the transistors constituting the pulse delay circuit 10.

This results in that the delay times of individual delay units DU can be uniformed, making it possible to improve the accuracy of time-length measurement of the time measuring circuit 1.

Note that the larger transistors constituting the pulse delay circuit 10 are in size, the greater the current drivability of the transistors are. For this reason, the charging and discharging of the output capacitance of the transistors more increases, and thus, the operating rate of the delay units DU more increases. In addition, the larger transistors constituting the pulse delay circuit 10 are in size, the greater the gate capacitance of the transistors are. The increase in the gate capacitance causes the operating rate of the delay units DU to decrease, and therefore it is preferable to determine the size of the transistors constituting the pulse delay circuit 10 with consideration given to the relation ship between the gate capacitance of the transistors and operating rate of the delay units DU.

Note that, in order to increase the transistors constituting the pulse delay circuit 10 in size, if the channel width and/or the gate widths of the transistors are excessively increased, resistance of the gate electrodes of the transistors cannot be negligible. This may make it difficult to get the drivability depending on the channel width and/or the gate widths of the transistors.

To address this problem, in the time measuring circuit 1, the gate of the transistors has a substantially comb shape. This allows the area of the gate electrodes and/or the drivability of the transistors to be ensured while preventing resistance of the gate electrodes from increasing.

Moreover, the ratio of the area of the pulse delay circuit 10 to the whole area of the time measuring circuit 1 is small. For this reason, even if the size of transistors constituting the pulse delay circuit 10 is increased, it is possible to prevent the circuit size of the time measuring circuit 1 from increasing in view of the whole of the time measuring circuit 1.

Second Embodiment

Figure 5A:
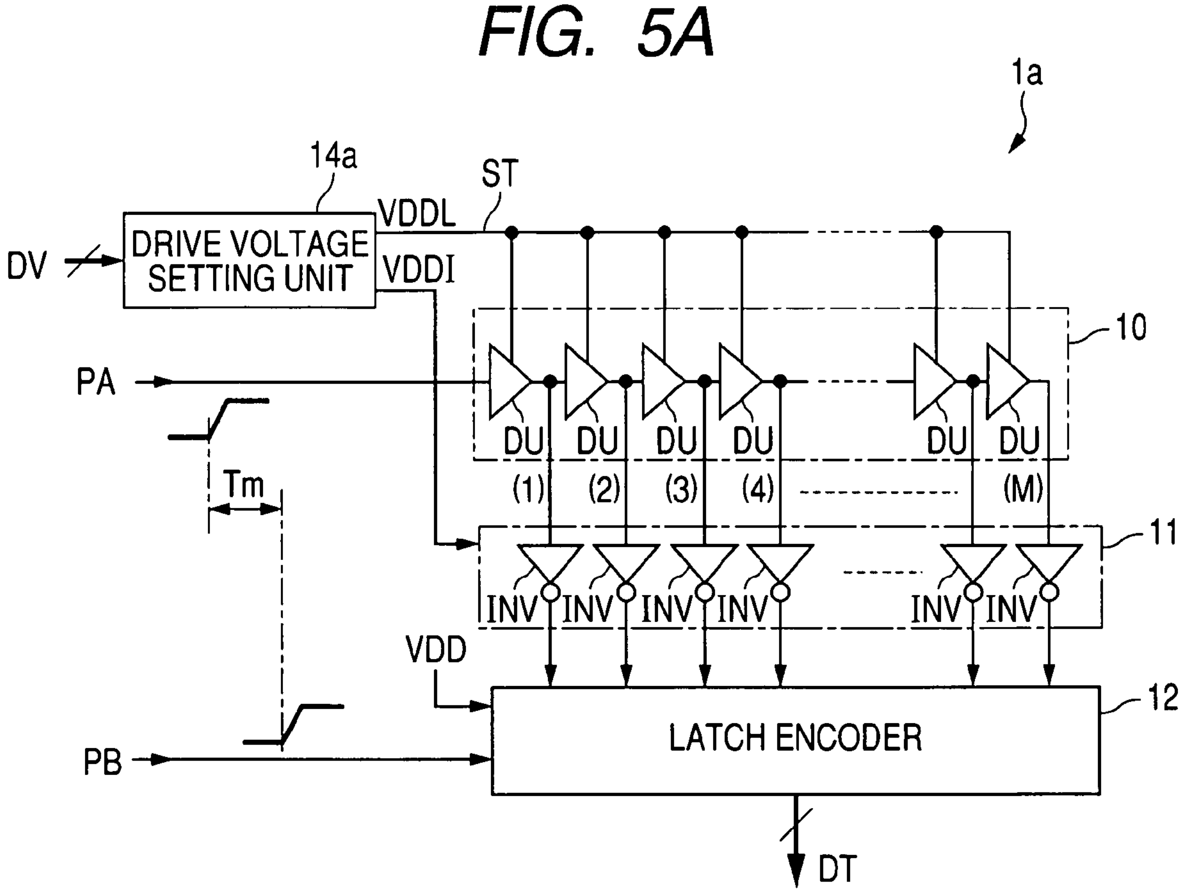
FIG. 5A is a block diagram schematically illustrating an example of the overall structure of a time measuring circuit according to a second embodiment of the present invention.
Figure 5B:
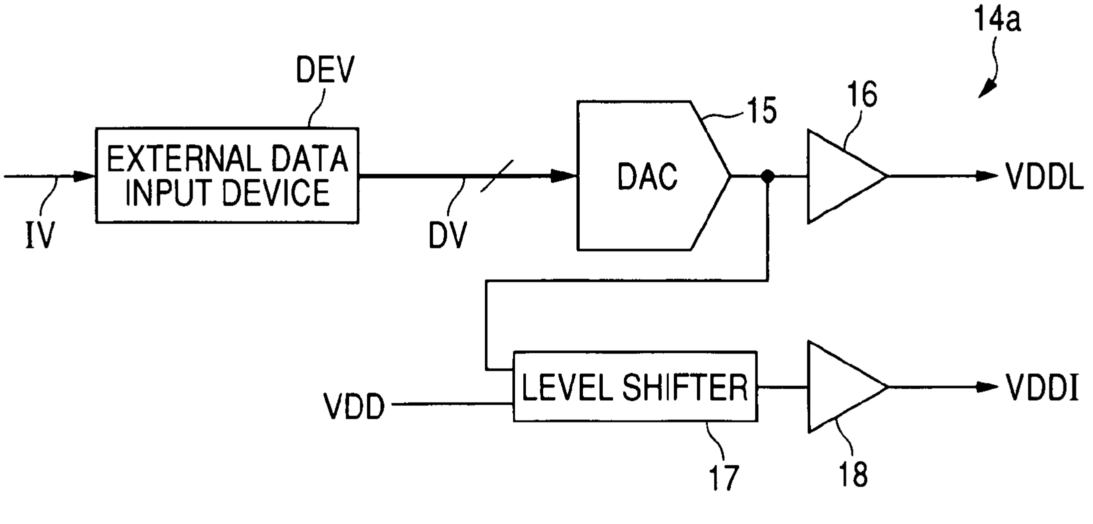
FIG. 5B is a block diagram schematically illustrating an example of the structure of a drive voltage setting unit illustrated in FIG. 5A.

FIG. 5A schematically illustrates an example of the overall structure of a time measuring circuit 1*a* according to a second embodiment of the present invention. FIG. 5B schematically illustrates an example of the structure of a drive voltage setting unit 14*a* according to the second embodiment.

As illustrated in FIG. 5A, the time measuring circuit 1*a* includes a transfer buffer 11 arranged between the pulse delay circuit 10 and the latch encoder 12 in addition to the structure of the time measuring circuit 1 according to the first embodiment.

The transfer buffer 11 is composed of a plurality of CMOS inverter gates INV whose number is the same as the number of delay pulse signals output from the respective delay units DU.

The transfer buffer 11 is operative to transfer a pulse signal output from each of the delay units DU to the latch encoder 12.

The latch encoder 12 is operative to detect a position that the significant edge of a pulse signal transferred from the transfer buffer 11 has reached when the measuring pulse PB is turned high, and convert the detected position of the pulse signal into predetermined bits of binary digital data (time measurement data) DT.

The remaining elements of the time measuring circuit 1*a* are substantially identical to the corresponding elements of the time measuring circuit 1, and therefore, the descriptions of the remaining elements of the time measuring circuit 1*a* can be omitted.

The size of transistors constituting the transfer buffer 11 is larger than that of transistors constituting the latch encoder 12, and smaller than that of transistors constituting the pulse delay circuit 10.

For example, each of the transistors constituting the transfer buffer 11 has a size three times as much as the minimum size of a transistor based on the CMOS-circuit design rules applied to manufacture the time measuring circuit 1.

The drive voltage setting unit 14 is composed of, in addition to the D/A converter 15 and the buffer 16, a level shifter 17 and a buffer 18. The level shifter 17 has first and second input terminals and an output terminal. The first input terminal of the level shifter 17 is connected to the output terminal of the D/A converter 15. To the second input terminal of the level shifter 17, the drive voltage VDD for the latch encoder 12 is configured to be input. The buffer 18 has an input terminal connected to the output terminal of the level shifter 17.

The level shifter 17 works to shift the output voltage (drive voltage VDDL) from the D/A converter 16 in level as compared with the level of the drive voltage VDD to thereby generate a voltage signal. The generated voltage signal has an intermediate level between the drive voltage VDDL for the pulse delay circuit 10 and the drive voltage for the latch encoder 12.

As in the case of the drive voltage setting unit 14, in the drive voltage setting unit **14*a*, the voltage setting data DV representing one of voltage levels corresponding to the voltage setting information IV is converted by the D/A converter 15 to be output, as the drive voltage VDDL, via the buffer 16** to each of the delay units DU.

In addition, in the drive voltage setting unit **14*a*, the drive voltage VDDL output from the D/A converter 15 is shifted in level by the level shifter 17. This allows the voltage signal having an average level between the drive voltage VDDL and the drive voltage VDD as the intermediate level therebetween to be output, as a drive voltage VDDI, via the buffer 18 to the transfer buffer 11** (each of the inverters INV).

The remaining components of the time measuring circuit **1*a* are substantially identical to those of the time measuring circuit 1**, and therefore descriptions of which are omitted.

In the time measuring circuit **1*a* according to the second embodiment, the transfer buffer 11 is provided. The transfer buffer 11 is operative to gradually buffer the differences in drive voltage and size between the transistors constituting the pulse delay circuit 10 and those constituting the latch encoder 12. This allows a pulse signal to be captured to the latch encoder 12 while the pulse signal has a substantially constant state. This makes it possible to ensure stability in operation of the time measuring circuit 1*a***.

Third Embodiment

Figure 6:
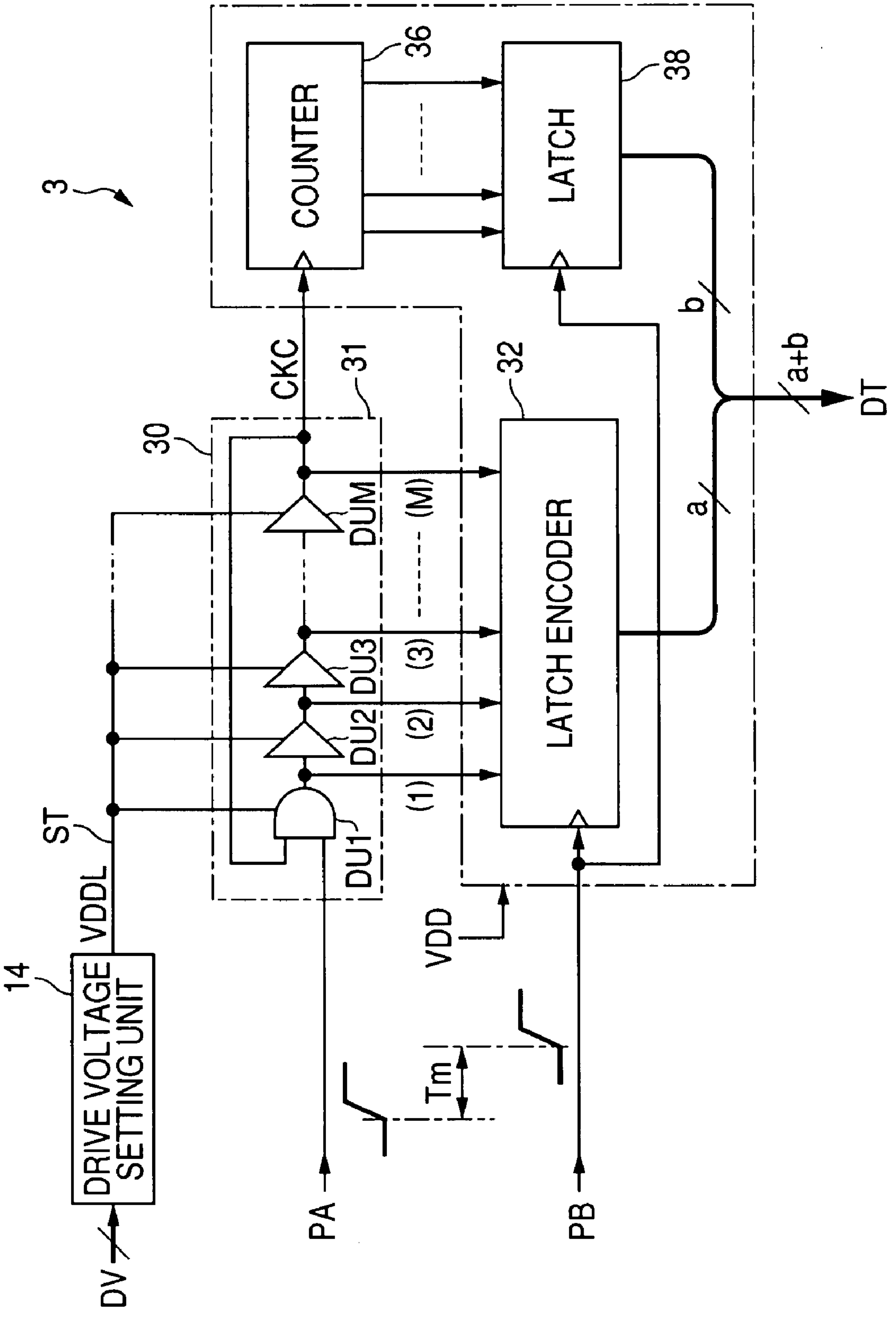
FIG. 6 is a block diagram schematically illustrating an example of the overall structure of a time measuring circuit according to a third embodiment of the present invention.

FIG. 6 illustrates an example of the overall structure of a time measuring circuit 3 according to a third embodiment of the present invention.

Specifically, as illustrated in FIG. 6, the time measuring circuit 3 includes a pulse delay circuit, in other words, a ring delay line (RDL) 30. The pulse delay circuit 30 is composed of a number of M of delay units DU that corresponds to the number M of stages in delay. The M is set to 2a (a is a positive integer).

Specifically, as the delay units DU, an AND gate DU1 and a plurality of inverters DU2 to DUM are preferably used.

The AND gate DU1 has one and the other input terminals and one output terminal, and is designed such that the starting pulse PA is input to the one input terminal thereof.

The AND gate DU1 and the inverters DU2 to DUM are connected in series in a ring. That is, the other input terminal of the AND gate DU1 and an output terminal of the final stage of inverter DUM are connected to each other so that the AND gate DU1 and the inverters DU2 to DUM are serially connected to have a ring-like structure, constituting the ring delay line 30.

The pulse delay circuit 30, as necessary, includes a circuit (not shown) operative to adjust the level of the pulse signal input to the AND gate DU1 via the other input terminal thereof so as to continuously circulate the pulse signal through the delay units DU.

Note that the detailed structure of the pulse delay circuit 30 has been described in, for example, U.S. Pat. Nos. 5,416,444 and 6,850,178 B2, so the descriptions of which are all incorporated herein by reference.

The time measuring circuit 3 includes a latch encoder 32 connected to the output terminal of each of the delay units DU. The measuring pulse PB is configured to be input to the latch encoder 32.

The latch encoder 32 is operative to detect a position that a significant edge of a pulse signal has reached when the measuring pulse PB is turned high, and convert the detected position of the pulse signal into "a" bits of binary digital data (a is a positive integer).

The time measuring circuit 3 includes a drive voltage setting unit 34 operative to generate the drive voltage VDDL based on the voltage setting data DV input from the external data input device DEV.

The structures of the latch encoder 32 and the drive voltage setting unit 34 are substantially identical to those of the latch encoder 12 and the drive voltage setting unit 14, respectively, and therefore, descriptions of which are omitted.

The time measuring circuit 3 also includes a b-bit synchronous counter (b is a positive integer) 36 serving as a coding circuit and connected to the output terminal of the final stage (delay unit DUM).

The counter 36 is operative to count up every time an output (circulating clock) CKC of the final stage DUM is input thereto.

The time measuring circuit 3 further includes a latch 38 connected to the counter 36. The measuring pulse PB is input to the latch 38.

Specifically, the latch 38 works to latch the count value of the counter 36 in response to the rising edge timing of the measuring pulse PB.

The time measuring circuit 3 is configured to:

combine the "a" bits of binary digital data output from the latch encoder 32 as lower-order bits and the "b" bits of binary digital data output from the latch 32 as higher-order bits, thereby generating time measurement data DT of "a+b" bits. The time measurement data DT is constructed by digitizing a period of time Tm since the rising timing of the starting pulse PA up to the riding timing of the measuring pulse PB.

Note that each of the synchronous counter 36 and the latch 38 is configured to be driven based on the drive voltage VDD as well as the latch encoder 32.

Like the first embodiment, the time measuring circuit 3 is configured as a semiconductor IC mounted on a semiconductor substrate (IC chip) using a CMOS process.

In the third embodiment, transistors constituting each of the latch encoder 32, the counter 36, the latch 38, and the subtractor 40 except for the pulse delay circuit 30 have the minimum size (see FIG. 3A).

In contrast, each of the transistors constituting the pulse delay circuit 30 has a size greater than the minimum size of a transistor. For example, each of the transistors constituting the pulse delay circuit 30 has a size six times as much as the minimum size of a transistor (see FIGS. 3A and 3B).

The maximum level of the drive voltage VDDL to be generated by the drive voltage setting unit 34 has been determined to be equivalent to the drive voltage VDD by which the latch encoder 32 is driven. The minimum level of the drive voltage VDDL to be generated by the drive voltage setting unit 34 has been determined to be equivalent to a threshold voltage of a CMOS inverter gate of the latch encoder 32 corresponding to each of the delay units DU. Specifically, each of the CMOS inverter gates of the latch encoder 32 works to latch an output of a corresponding one of the delay units DU. For example, the threshold voltage of each of the CMOS inverter gates of the latch encoder 32 is set to a half of the drive voltage VDD.

In the time measuring circuit 3 according to the third embodiment, the pulse delay circuit 30 is designed as a ring delay line, and the number of circulations of the pulse signal through the ring delay line is designed to be counted by the counter 36.

For this reason, the number of the stages of the delay units DU can be reduced, and therefore, the circuit size of the whole of the time measuring circuit 3 can be reduced.

In the time measuring circuit 3 according to the third embodiment, the size of transistors constituting the pulse delay circuit 30 is larger than that of transistors constituting each of the latch encoder 32, counter 36, latch 38, and subtractor 40 except for the pulse delay circuit 30. This can reduce variations in the characteristics of the transistors constituting the pulse delay circuit 30 due to dimensional deviations of the transistors constituting the pulse delay circuit 30 in manufacturing and/or adhesion of debris particles onto the transistors constituting the pulse delay circuit 30.

This results in that the delay times of individual delay units DU can be uniformed, making it possible to improve the accuracy of time-length measurement of the time measuring circuit 1.

Fourth Embodiment

Figure 7:
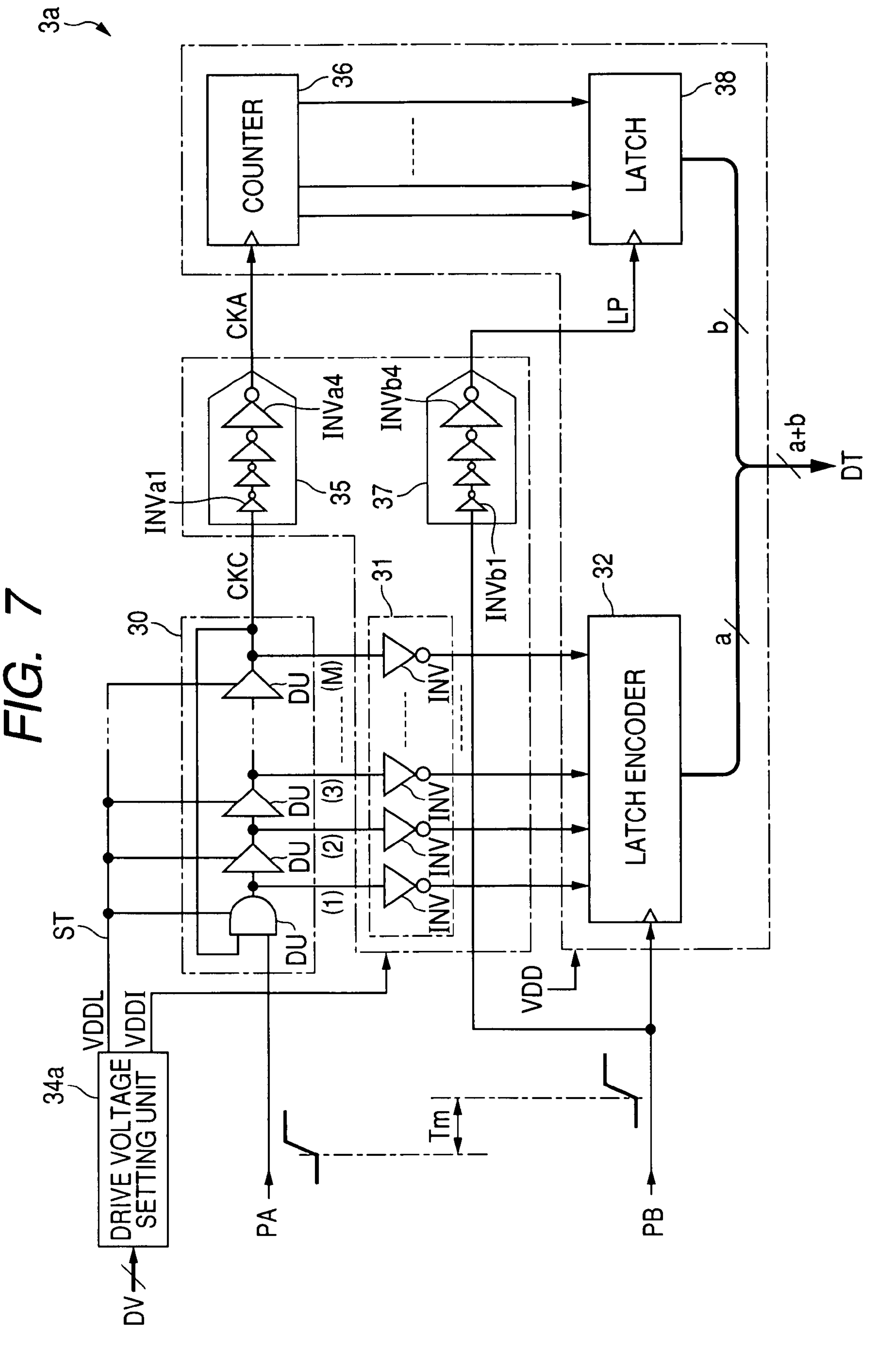
FIG. 7 is a block diagram schematically illustrating an example of the overall structure of a time measuring circuit according to a fourth embodiment of the present invention.

FIG. 7 schematically illustrates an example of the overall structure of a time measuring circuit 3*a* according to a fourth embodiment of the present invention.

As illustrated in FIG. 7, the time measuring circuit 3*a* includes a transfer buffer 31 arranged between the pulse delay circuit 30 and the latch encoder 32 in addition to the structure of the time measuring circuit 3 according to the third embodiment.

The latch encoder 32 is operative to detect a position that the significant edge of a pulse signal transferred from the transfer buffer 31 has reached when the measuring pulse PB is turned high, and convert the detected position of the pulse signal into predetermined bits of binary digital data (time measurement data) DT.

In addition, the time measuring circuit 3*a* includes a drive buffer 35 connected to the output terminal of the final stage DUM and to the counter 36 via an input line.

The drive buffer 35 is operative to receive the circulating clock CKC output from the final stage DUM and supply, to the counter 36, the received circulating clock CKC as an operating clock CKA.

The time measuring circuit 3*a* includes a delay buffer 37 connected to the latch 38 via an input line, and configured such that the measuring pulse PB is input thereto.

The delay buffer 37 is operative to receive the measuring pulse PB input thereto and supply, to the latch 38, the measuring pulse PB as a latch pulse signal LP.

The remaining elements of the time measuring circuit 3*a* are substantially identical to the corresponding elements of the time measuring circuit 3, and therefore, the descriptions of the remaining elements of the time measuring circuit 3*a* can be omitted.

The structures of the transfer buffer 31 and the drive voltage setting unit 34 are substantially identical to those of the transfer buffer 11 and the drive voltage setting unit 14*a*, respectively, and therefore, descriptions of which are omitted.

The drive buffer 35 is composed of a plurality of CMOS inverter gates INVa1 to INVan, such as INVa1 to INVa4 in FIG. 7 as an example, connected to each other in series. The first stage of the CMOS inverter gate INVa1 is connected to the output terminal of the final stage DUM, and the final stage (CMOS inverter gate INVa4) is connected to the counter 36 via the input line. The size of the final-stage CMOS inverter gate INVa4 is set to have a drivability sufficient to drive the counter 36 against the input capacitance of the input line.

The remaining COM inverter gates INVa1 to INVa3 have drivabilities gradually greater in the order from the first stage INVa1 to the third stage INVa3. In other words, the remaining COM inverter gates INVa1 to INVa3 have sizes gradually greater in the order from the first stage INVa1 to the third stage INVa3. Note that the first-stage CMOS inverter gate INVa1 has a size equal to or greater than that of each of the transistors constituting the pulse delay circuit 30.

Similarly, the delay buffer 37 is composed of a plurality of CMOS inverter gates INVb1 to INVbn, such as INVb1 to INVb4 in FIG. 7 as an example, connected to each other in series. The first-stage CMOS inverter gate INVb1 is configured such that the measuring pulse PB is input thereto, and the final-stage CMOS inverter gate INVb4 is connected to the latch 38 via the input line. The size of the final-stage CMOS inverter gate INVb4 is set to have a drivability sufficient to drive the latch 38 against the input capacitance of the input line.

The remaining CMOS inverter gates INVb1 to INVb3 have drive capabilities gradually greater in the order from the first stage INVb1 to the third stage INVb3. In other words, the remaining CMOS inverter gates INVb1 to INVb3 have sizes gradually greater in the order from the first stage INVb1 to the third stage INVb3. Note that the first-stage CMOS inverter gate INVb1 has a size larger than that of each of the transistors constituting the pulse delay circuit 30.

The total delay time of the drive buffer 35 is designed to be equivalent to that of the delay buffer 37.

In the structure of the time measuring circuit 3*a* set forth above, the transfer buffer 31 is provided. The transfer buffer 31 is operative to gradually buffer the differences in threshold voltage and size between the transistors constituting the pulse delay circuit 30 and the transistors constituting the latch encoder 32. This allows a pulse signal to be captured to the latch encoder 32 while the pulse signal has a substantially constant state. This makes it possible to ensure stability in operation of the time measuring circuit 3*a*.

In addition, in the time measuring circuit 3*a*, the operating clock CKA is supplied to the counter 36 via the drive buffer 35. The size of the final-stage CMOS inverter gate INVa4 is set to have a drivability sufficient to drive the counter 36 against the input capacitance of the input line. For this reason, it is possible to ensure stability in operation of the counter 36 even if the counter 36 has many bits so that the input capacitance of the input line is high.

Similarly, in the time measuring circuit 3*a*, the latch pulse signal LP is supplied to the latch 38 via the delay buffer 37. The total delay time of the drive buffer 35 is designed to be equivalent to that of the delay buffer 37. For this reason, it is possible to match the operating timing of the counter 36 with the latch timing of the latch 38.

In each of the first to fourth embodiments, each of the delay units DU is composed of the first CMOS inverter gate INV and the second CMOS inverter gate INV connected to each other in series. The first CMOS inverter INV consists of a pair of a P-channel MOSFET and an N-channel MOSFET connected thereto in series, and the second CMOS inverter gate INV consists of a pair of a P-channel MOSFET and an N-channel MOSFET connected thereto in series. In addition, the drive voltage VDDL is configured to be input to each of the delay units DU. The present invention however is not limited to the structure.

Figure 8A:
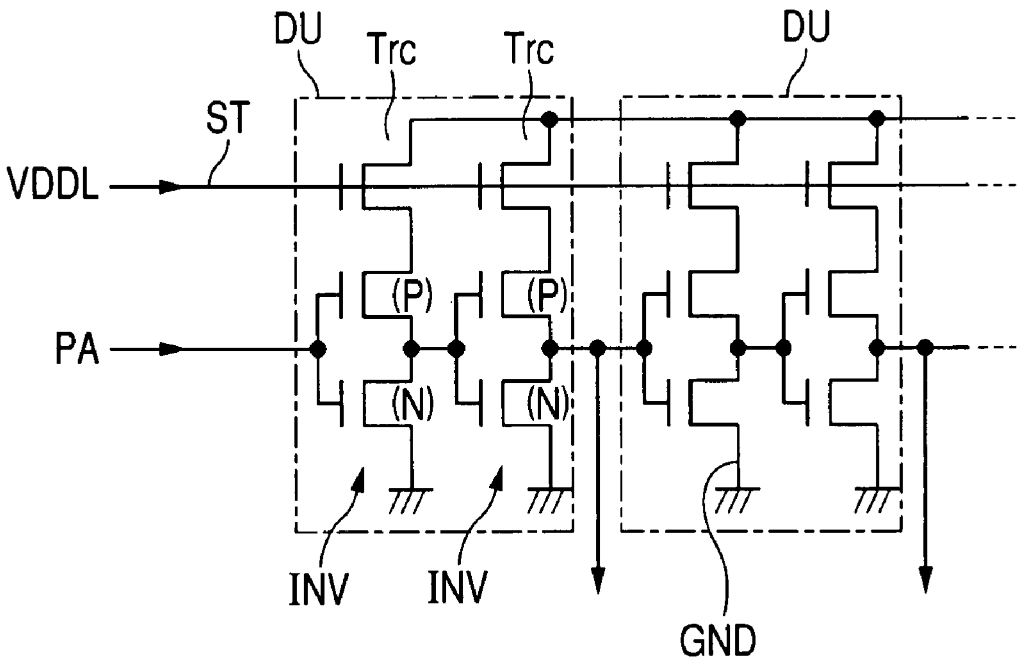
FIG. 8A is a circuit diagram schematically illustrating an example of the structure of delay units according to a modification of each of the first to fourth embodiments.

Specifically, as illustrated in FIG. 8A, a control transistor (MOSFET) Trc can be provided for each of the CMOS inverter gates INV. The drive voltage VDDL can be configured to be input to the gate of the control transistor Trc. The control transistor Trc can be operative to cause a drive current to flow through each of the CMOS inverter gates INV based on the drive voltage VDDL applied to the gate thereof.

Specifically, as illustrated in FIG. 8A, the operating time of each of the CMOS inverter gates varies depending on the change in the drive current to be supplied to each of the CMOS inverter gates. For this reason, control of the drive current to be supplied to each of the individual CMOS inverter gates INV can obtain the effects identical to those of the first to fourth embodiments. In this case, because the input impedance is increased, it is possible to omit the buffers 14 and 34.

Figure 8B:
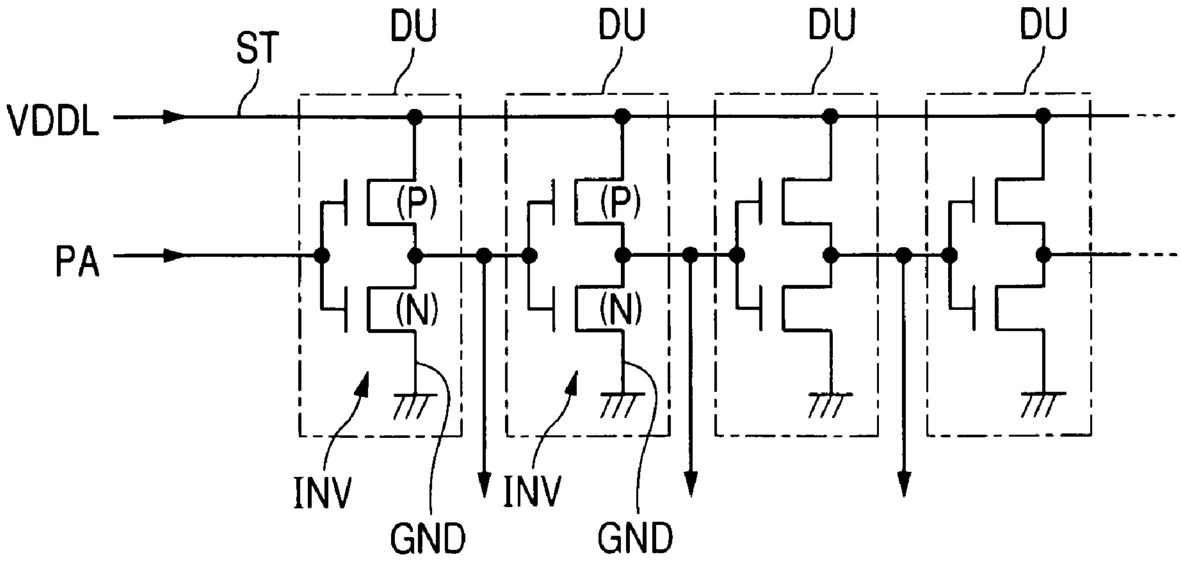
FIG. 8B is a circuit diagram schematically illustrating an example of the structure of delay units according to another modification of each of the first to fourth embodiments.

In addition, as illustrated in FIG. 8B, each of the delay units DU can be composed of a single stage of CMOS inverter gate INV consisting of a pair of a P-channel MOSFET and an N-channel MOSFET connected thereto in series. Moreover, each of the delay units DU can be composed of three or more stages of CMOS inverter gates INV.

In each of the first to fourth embodiments, the D/A converter 15 is configured to generate the drive voltage VDDL based on the voltage setting data DV, but the present invention is not limited to the structure.

Figure 9:
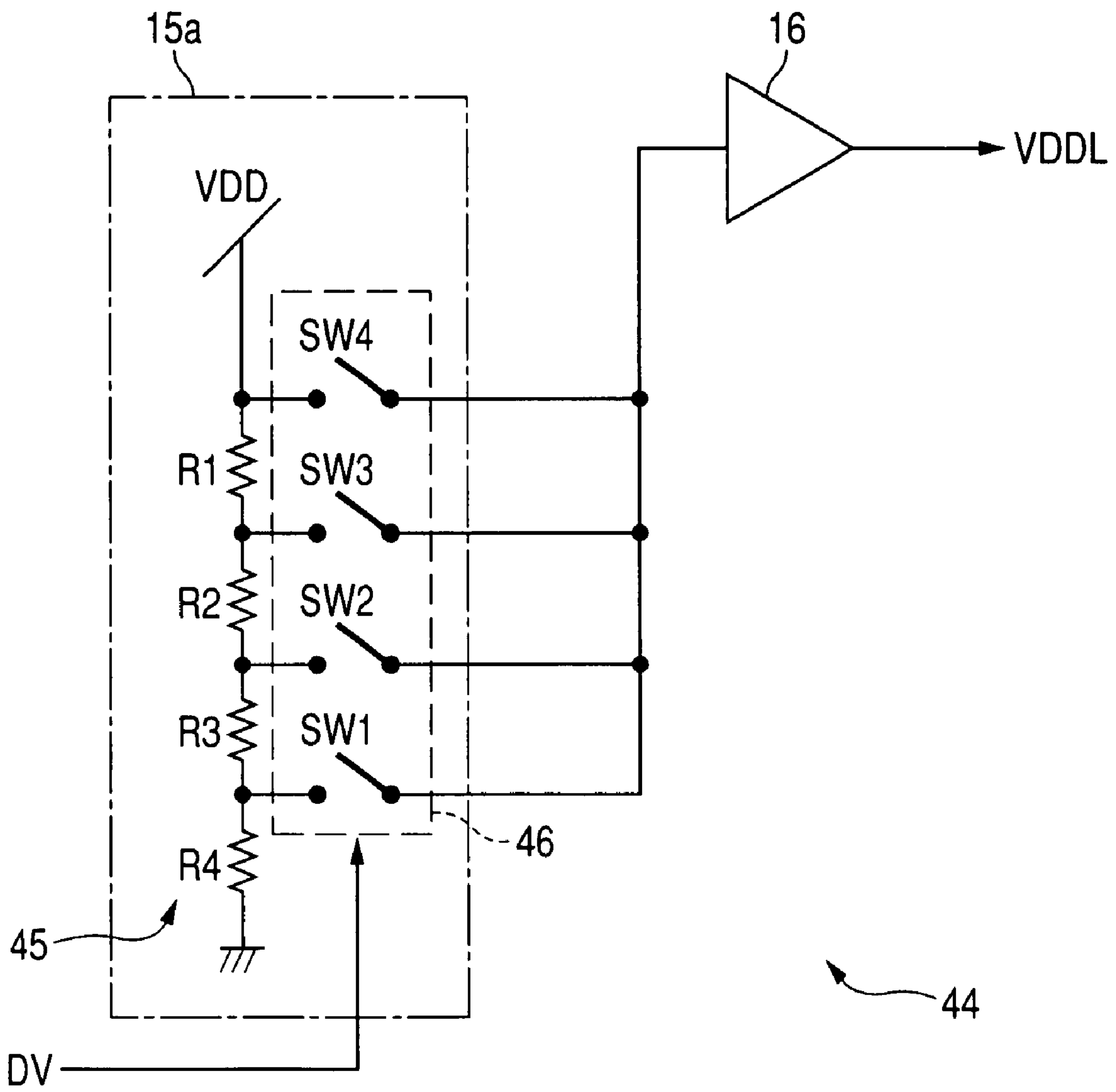
FIG. 9 is a circuit diagram schematically illustrating an example of the structure of a drive voltage setting unit according to a modification of the first to fourth embodiments.

Specifically, as illustrated in FIG. 9, a drive voltage setting unit 44 according to a modification of the drive voltage setting unit 14 is composed of a voltage selecting circuit 15*a* and the buffer 16.

The voltage selecting circuit 15*a* includes a voltage divider 45 consisting of a number of, such as four, resistors R1 to R4 connected to each other in series in this order. To one end of the resistor R1, the drive voltage VDD is configured to be applied. One end of the resistor R4 is grounded.

The voltage selecting circuit 15*a* also includes a switching unit 46 consisting of a number of, such as four, switches SW1 to SW4 corresponding to the resistors R4 to R1, respectively. Specifically, the switch SW1 is connected at its one end to a connecting point between the resistors R3 and R4, and the switch SW2 is connected at its one end to a connecting point between the resistors R2 and R3. The switch SW3 is connected at its one end to a connecting point between the resistors R1 and R2, and the switch SW4 is connected at its one end to the one end of the resistor R1 to which the drive voltage VDD is applied.

The other ends of the switches SW1 to SW4 are parallely connected to an input line, and the input line is connected to the input terminal of the buffer 16.

The switching unit 46 is communicable with the external data input device DEV, and operative to selectively turn on any one of the switches SW1 to SW4 based on voltage setting data DV input from the external data input device DEV. Resistances of the resistors R1 to R4 can be determined depending on a desirable time range that a user wants to measure using the time measuring circuit.

For example, when the voltage setting data DV represents the switch SW3, the switching unit 46 turns on the switch SW3. This allows the drive voltage VDDL to be output via the buffer 16 to each of the delay units DU; this drive voltage VDDL has a level V given by the following equation:

$$V = VDD\frac{R2 + R3 + R4}{R1 + R2 + R3 + R4}$$

For another example, when the voltage setting data DV represents the switch SW1, the switching unit 46 turns on the switch SW1. This allows the drive voltage VDDL to be output via the buffer 16 to each of the delay units DU; this drive voltage VDDL has a level V given by the following equation:

$$V = VDD\frac{R4}{R1 + R2 + R3 + R4}$$

As described above, in the voltage selecting circuit 15*a*, selection of any one of the switches SW1 to SW4 can change the level of the drive voltage VDDL to be output via the buffer 16 to each of the delay units DU.

In the first to fourth embodiments, change the number of the gate electrodes Gp and Gn of the CMOS inverter gate INV2 allows the size of the transistors P2 and N2 (the size of the CMOS inverter gate INV2) to be adjusted. Change of the gate width L of each of the gate electrodes Gp, Gn of the CMOS inverter gate INV2 can adjust the size of the transistors P2 and N2 (the size of the CMOS inverter gate INV2). In addition, change of the channel width Wp of the CMOS inverter gate INV2 and/or that of the channel width Wn of the CMOS inverter gate INV2 can adjust the size of the transistors P2 and N2 (the size of the CMOS inverter gate INV2).

Figure 10A:
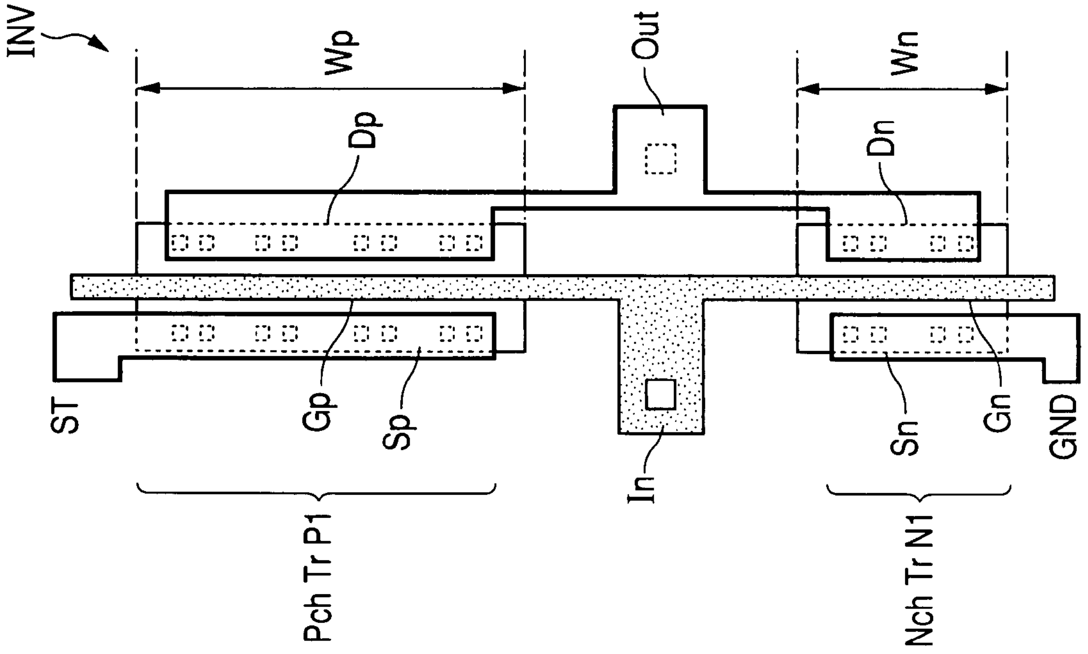
FIG. 10A is a view schematically illustrating a conductor pattern of a CMOS inverter gate to be used for the time measuring circuit illustrated in FIG. 1A according to the first to fourth embodiments.

In the first to fourth embodiments, the channel width Wp of the CMOS inverter INV is twice as much as the channel width Wn thereof, which allows a threshold voltage of the CMOS inverter INV to be a half of a corresponding drive voltage (see FIG. 10A), but the present invention is not limited to the structure.

Figure 10B:
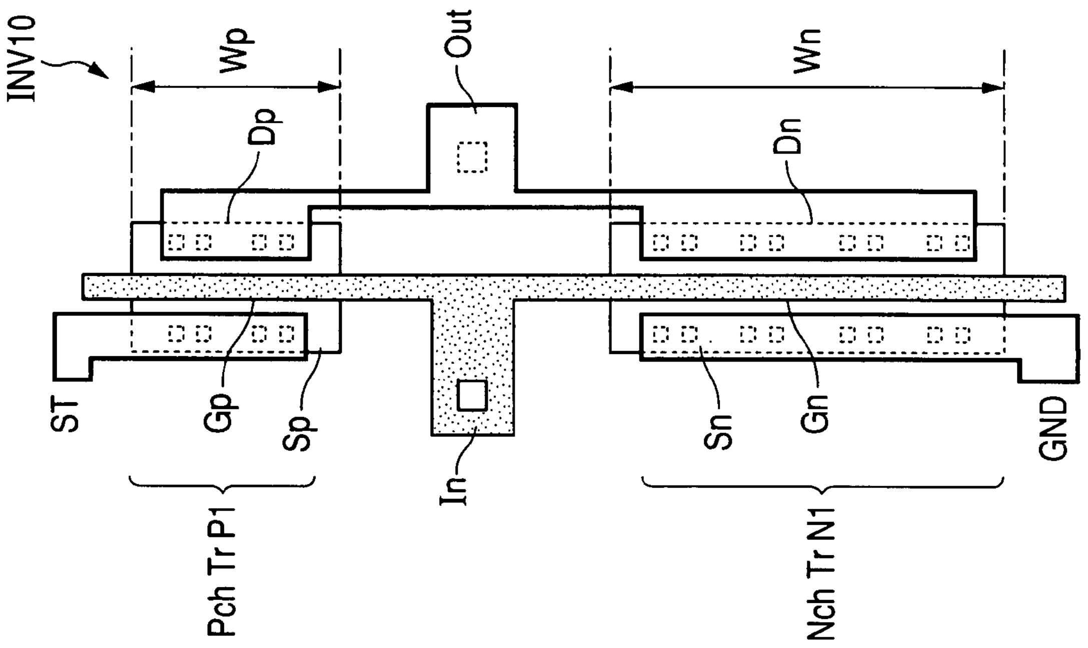
FIG. 10B is a view schematically illustrating a conductor pattern of another CMOS inverter gate to be used for the time measuring circuit illustrated in FIG. 1A according to a modification of the first to fourth embodiments.

Specifically, in a CMOS inverter gate INV10 arranged to directly receive an output from each of the delay units DU, the channel width Wn can be equivalent to the channel width Wp, or the channel width Wn can be two times greater than the channel width Wp (see FIG. 10B). This makes it possible to increase the drivability of the N-channel transistor N of the CMOS inverter gate INV10. The increase in the drivability of the N-channel transistor N of the CMOS inverter gate INV10 allows a threshold voltage of the CMOS inverter gate INV10 to decrease ranging between approximately one-third and one-fourth of a corresponding drive voltage.

The decrease in the threshold voltage of the CMOS inverter gate INV10 arranged to directly receive an output from each of the delay units DU allows a settable range of the drive voltage VDDL for the delay units 10 by each of the drive voltage setting units 14, 14*a*, 34, and 34*a* to be expanded. This makes it possible to increase the range of uses of the time measuring circuits 1, 1*a*, 3, and 3*a*.

In the first to fourth embodiments, each of the drive voltage setting units 14, 14*a*, 34, and 34*a* is configured to generate the drive voltage VDDL whose level is equal to or lower than the constant drive voltage VDD for the latch encoder 12. The present invention is however not limited to the structure.

Specifically, each of the drive voltage setting units 14, 14*a*, 34, and 34*a* can be designed to generate the drive voltage VDDL whose level is equal to or higher than the constant drive voltage VDD for the latch encoder 12. In this modification, it is necessary to supply, from the battery or power source, the power supply voltage to each of the drive voltage setting units 14, 14*a*, 34, and 34*a*; this power supply voltage has a level equal to or higher than the drive voltage VDDL for each of the delay units DU.

In the second and fourth embodiments, each of the transistors constituting the transfer buffers 11 and 31 can have the threshold voltage Vth1 or Vth4.

In the second and fourth embodiments, the drive voltage VDDI for each of the transfer buffers 11 and 31, the drive buffer 35, and the delay buffer 37 is set to an intermediate level between the drive voltage VDDL for a corresponding pulse delay circuit and the drive voltage VDD for the latch encoder 12 or 32. The present invention is however not limited to the structure.

Specifically, the drive voltage VDDI can be set to either the drive voltage VDDL for a corresponding pulse delay circuit or the drive voltage VDD for the latch encoder 12 or 32.

In the first to fourth embodiments, as the measuring pulse PB, a pulse signal PB' consisting of a series of periodic pulses can be used.

In this modification, the latch encoder 12 (32) can be operative to detect a position that a significant edge, such as rising edge, of the pulse signal has reached when every time measuring pulse signal PB' is turned high, and convert the detected position of the pulse signal into predetermined bits of binary digital data DT.

The digital data DT of the predetermined bits represents what number stage from the first stage (first delay unit) is a delay unit through which the pulse signal at the detected position has passed within a period of time Tm since the rising timing of the starting pulse PA up to an appearance of each of the riding timings of the measuring pulse signal PB'.

This modification makes it possible for each of the time measuring circuits 1, 1*a*, 3, and 3*a* to measure lap times each corresponding to a period of time Tm since the rising timing of the starting pulse PA up to each of the riding timings of the measuring pulse signal PB'.

While there has been described what is at present considered to be the embodiments and their modifications of the present invention, it will be understood that various modifications which are not described yet may be made therein, and it is intended to cover in the appended claims all such modifications as fall within the true spirit and scope of the invention.

What is claimed is:

1. A time measuring circuit comprising:

a pulse delay circuit provided with a plurality of delay units, the pulse delay circuit being configured to transfer a pulse signal through the plurality of delay units while the pulse signal is delayed by the plurality of delay units, a delay time of each of the plurality of delay units depending on a level of a first drive voltage being input to each of the plurality of delay units;

a generating circuit configured to obtain a number of the delay units through which the pulse signal has passed within a predetermined period to generate, as time measurement data, digital data based on the obtained number; and a first setting unit configured to variably set the level of the first drive voltage being input to each of the plurality of delay units.

2. A time measuring circuit according to claim 1, wherein the generating circuit includes a circuit configured to receive the pulse signal transferred from each of the plurality of delay units, the circuit being composed of at least one transistor, the at least one transistor having a threshold voltage level, a minimum level of the first drive voltage settable by the first setting unit having been determined, the minimum level of the first drive voltage being greater than the threshold voltage level.

3. A time measuring circuit according to claim 1, wherein a range of the level of the first drive voltage settable by the first setting unit has been determined to be equal to or lower than a level of a second drive voltage, the second drive voltage allowing the generating circuit to be driven.

4. A time measuring circuit according to claim 1, wherein each of the plurality of delay units is composed of at least one first transistor having a first size, the generating circuit is composed of at least one second transistor having a second size, the first size of the at least one first transistor being greater than the second size of the at least one second transistor.

5. A time measuring circuit according to claim 4, wherein the at least one first transistor comprises a gate electrode, the gate electrode of the at least one first transistor has a substantially comb shape.

6. A time measuring circuit according to claim 4, wherein the at least one first transistor comprises:

a semiconductor substrate;

a plurality of drain regions;

a plurality of source regions, the plurality of drain regions and the plurality of source regions being alternatively formed on the semiconductor substrate with channel regions therebetween; and a gate including:

a first strip electrode arranged between the source and drain regions; and a plurality of second strip electrodes orthogonally extending from the first strip electrode, the plurality of substantially second strip electrodes being arranged above the channel regions, respectively.

7. A time measuring circuit according to claim 1, wherein the generating circuit is configured to be driven by a second drive voltage with a level, further comprising:

a first buffer circuit arranged between the pulse delay circuit and the generating circuit and driven by a third drive voltage being input thereto, the first buffer circuit being configured to transfer the pulse signal output from each of the delay units to the generating circuit; and a second setting unit configured to set the level of the third drive voltage being input to the first buffer such that the level of the third drive signal is intermediate between the level of the first drive voltage and the level of the second drive voltage.

8. A time measuring circuit according to claim 7, wherein the plurality of delay units are serially connected to each other in a ring to form a ring delay line, and the generating circuit comprises:

a counter configured to count a number of circulations of the pulse signal through the ring delay line;

a lower-order coding circuit configured to detect a position that the pulse signal has reached within the predetermined period and convert the detected position of the pulse signal into lower-order bits of the digital data; and a higher-order coding circuit configured to output a count value of the counter as higher-order bits of the digital data, further comprising:

a second buffer circuit configured to transfer one of the pulse signals output from the plurality of delay units to the counter as an operating clock.

9. A time measuring circuit according to claim 1, wherein the pulse delay circuit is configured to start the transfer of the pulse signal upon input of a first pulse to the pulse delay circuit, and the generating circuit is configured to obtain a number of the delay units through which the pulse signal has passed since the input of the first pulse to the pulse delay circuit up to an input of a second pulse to the generating circuit.

10. A time measuring circuit according to claim 9, wherein the second pulse is composed of a series of periodic second pulses, and the generating circuit is configured to obtain a number of the delay units through which the pulse signal has passed since the input of the first pulse to the pulse delay circuit up to an appearance of each of same-directed significant edges of the second pulses.

* * * * *